US012684929B2

(12) United States Patent
Sillevis Smitt et al.

(10) Patent No.: US 12,684,929 B2
(45) Date of Patent: Jul. 14, 2026

(54) MICROLED ARRAY WITH YELLOW SUB-PIXELS

(71) Applicant: Lumileds LLC, San Jose, CA (US)

(72) Inventors: Johannes Willem Herman Sillevis Smitt, San Jose, CA (US); Brendan Jude Moran, San Jose, CA (US); Zhongmin Ren, Danville, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/979,070

(22) Filed: Dec. 12, 2024

(65) Prior Publication Data

US 2025/0255066 A1     Aug. 7, 2025

Related U.S. Application Data

(60) Provisional application No. 63/550,091, filed on Feb. 6, 2024.

(51) Int. Cl.
*H10H 29/30* (2025.01)
*G09G 3/32* (2016.01)
*H10H 29/34* (2025.01)

(52) U.S. Cl.
CPC ............. *H10H 29/362* (2025.01); *G09G 3/32* (2013.01); *H10H 29/34* (2025.01); *G09G 2320/0666* (2013.01)

(58) Field of Classification Search
CPC ............. G09G 3/32; G09G 2320/0666; H10H 29/362; H10H 29/34; H01L 25/167
See application file for complete search history.

(56) References Cited

U.S. PATENT DOCUMENTS

| | | | | |
|---|---|---|---|---|
| 7,623,560 B2 * | 11/2009 | El-Ghoroury | .......... | B82Y 20/00 |
| | | | | 353/38 |
| 7,767,479 B2 * | 8/2010 | El-Ghoroury | ........ | H04N 9/3161 |
| | | | | 348/E9.026 |
| 7,829,902 B2 * | 11/2010 | El-Ghoroury | ............. | H01S 5/18 |
| | | | | 372/50.122 |
| 8,049,231 B2 * | 11/2011 | El-Ghoroury | .......... | B82Y 20/00 |
| | | | | 353/38 |
| 8,243,770 B2 * | 8/2012 | El-Ghoroury | .......... | B82Y 20/00 |
| | | | | 257/256 |
| 8,567,960 B2 * | 10/2013 | El-Ghoroury | ........ | H04N 9/3161 |
| | | | | 257/14 |
| 8,890,904 B2 * | 11/2014 | Kang | ........................ | G09G 5/10 |
| | | | | 348/223.1 |
| 9,001,165 B2 * | 4/2015 | Park | ..................... | G09G 3/2003 |
| | | | | 345/83 |
| 9,165,496 B1 * | 10/2015 | Jung | ..................... | G09G 3/2003 |
| 9,276,766 B2 * | 3/2016 | Knapp | .................... | H04L 12/42 |

(Continued)

*Primary Examiner* — Vinh T Lam
(74) *Attorney, Agent, or Firm* — Schwegman, Lundberg & Woessner, P.A.

(57)     ABSTRACT

A lighting system and method of driving an array of micro light emitter (microLED) pixels are disclosed. Each pixel contains a blue sub-pixel configured to emit blue light, a red sub-pixel configured to emit red light, a green sub-pixel configured to emit green light, and a yellow sub-pixel configured to emit yellow light. A processor selects, for each pixel to produce white light, between driving the blue sub-pixel and yellow sub-pixel to produce the white light and driving the blue sub-pixel, the red sub-pixel, the green sub-pixel, and the yellow sub-pixel to produce the white light.

19 Claims, 9 Drawing Sheets

300

302a 304a 306a
302
304
306
308

308a

(56)                    References Cited

U.S. PATENT DOCUMENTS

|  |  |  |  |  |
|---|---|---|---|---|
| 9,347,647 | B2 * | 5/2016 | Hamer | G09G 3/3225 |
| 9,558,700 | B2 * | 1/2017 | Sakaigawa | G02F 1/13624 |
| 9,595,221 | B2 * | 3/2017 | Hamer | G09G 3/2003 |
| 9,754,527 | B2 * | 9/2017 | Jung | G09G 3/2003 |
| 10,133,426 | B2 * | 11/2018 | Den Boer | G02F 1/13338 |
| 10,672,318 | B2 * | 6/2020 | Lee | G09G 3/3291 |
| 10,789,897 | B2 * | 9/2020 | Chen | G09G 3/3607 |
| 10,861,416 | B2 * | 12/2020 | Kim | G09G 5/06 |
| 11,475,817 | B2 * | 10/2022 | Schrama | G09G 3/2003 |
| 11,971,616 | B1 * | 4/2024 | Wyatt | G09G 3/3413 |
| 12,021,070 | B2 * | 6/2024 | Jia | G09F 9/335 |
| 12,057,541 | B2 * | 8/2024 | Meitl | H05B 45/20 |
| 12,260,811 | B2 * | 3/2025 | Wu | G09G 3/32 |
| 12,444,334 | B2 * | 10/2025 | Bogdanowicz | G09G 3/2003 |
| 2016/0343294 | A1 * | 11/2016 | Lee | G09G 3/32 |
| 2018/0374435 | A1 * | 12/2018 | Chen | G09G 3/3607 |
| 2022/0398962 | A1 * | 12/2022 | Schrama | G09G 3/2003 |
| 2024/0274758 | A1 * | 8/2024 | Ye | H10H 20/8512 |

* cited by examiner

Determine that a pixel is to emit white light

702

Limit driving to blue and yellow sub-pixels of the pixel to produce white light

704

700

MICROLED ARRAY WITH YELLOW SUB-PIXELS

PRIORITY CLAIM

This application claims the benefit of priority under 35 U.S.C. 119(e) to U.S. Provisional Patent Application Ser. No. 63/550,091, filed Feb. 6, 2024, which is incorporated herein by reference in its entirety.

BACKGROUND OF THE DISCLOSURE

Light-emitting diodes (LEDs) provide an efficient and relatively smaller source of light compared to conventional light sources. The use of LEDs has evolved from systems that provide purely lighting to more complicated systems that use light in various ways other than merely to provide illumination of an area. Consequently, there is ongoing effort to improve technology that uses LED arrays, as well as find additional uses for LED arrays.

BRIEF DESCRIPTION OF THE DRAWINGS

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

Figures 1A, 1B:
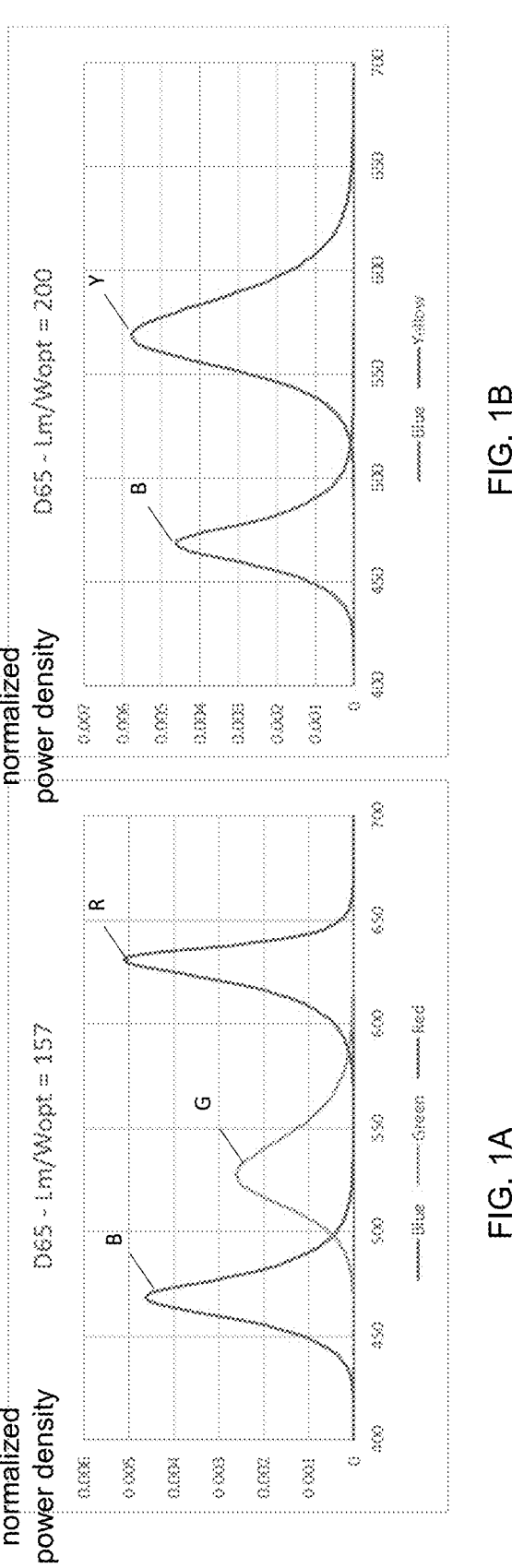
FIG. 1A shows an example spectral power distribution (lm/Wopt curve) of a microLED pixel with red, green, and blue sub-pixels in accordance with some aspects.
FIG. 1B shows an example spectral power distribution of a microLED pixel with blue and yellow sub-pixels in accordance with some aspects.

The use of the LEDs in electronic devices has increased rapidly as the number and types of devices have expanded in various ways. Beyond mere displays, for example, compact light sources have recently been incorporated in augmented reality (AR) and virtual reality (VR) devices, among others. Such devices may be enabled by microLED arrays.

LEDs may be have different light emitting areas and may be grouped in arrays in which the LEDs are able to be individually driven or driven in sets of LEDs. A microLED array, for example, may contain thousands to millions of microscopic microLEDs that may be individually controlled or controlled in groups of pixels (e.g., 5×5 groups of pixels). MicroLEDs are relatively small (e.g., <0.07 mm on a side) and may provide monochromic or multi-chromic light, typically red, green, blue, or yellow using inorganic semiconductor material. Other LEDs may have a size, for example, of about 4 mm², 250 micron×250 micron, or larger. In other aspects, an LED array may use LEDs of other sizes (e.g., miniLEDs that are larger than the microLEDs).

Active layers of LEDs in general may be formed from one or more inorganic materials (e.g., binary compounds such as gallium arsenide (GaAs), ternary compounds such as aluminum gallium arsenide (AlGaAs) or indium gallium nitride (InGaN), quaternary compounds such as indium gallium aresenide phosphide (InGaAsP), gallium nitride (GaN), or other suitable materials), usually either III-V materials (defined by columns of the Periodic Table) or II-VI materials.

LEDs in different arrays may emit light in the visible spectrum (about 400 nm to about 800 nm) and/or may emit light in the infrared spectrum (above about 800 nm). LEDs may be formed by epitaxially growing active, n- and p-type semiconductors on a rigid or non-rigid substrate (which may or may not be textured). The substrate may include, for example, silicon (Si), sapphire aluminum oxide (Al₂O₃) or silicon carbide (SiC), Polyethylene terephthalate (PET), among others. In particular, various layers are deposited and processed on the substrate during fabrication of the LEDs to form an LED array. The surface of the substrate may be pretreated to anneal, etch, polish, etc. the surface prior to deposition of the various layers. In some aspects, the growth substrate may be removed and replaced by a thin transparent rigid substrate, such as glass, or a flexible substrate, for example plastic or a flexible printed circuit board (PCB). In general, the various active layers may be fabricated using epitaxial semiconductor deposition to deposit one or more semiconductor layers, metal deposition (e.g., by sputtering), oxide growth, as well as etching, liftoff, and cleaning, among other operations.

In some aspects, the growth substrate may be removed from the microLED structure after fabrication and after connection to contacts on a backplane via metal bonding such as wire or ball bonding. The backplane may be a printed circuit board or wafer containing integrated circuits (ICs), such as a complementary metal oxide semiconductor (CMOS) IC wafer. The semiconductor deposition operations may be used to create a microLED with an active region in which electron-hole recombination occurs and the light from the microLED is generated. The active region may be, for example, one or more quantum wells. Metal contacts may be used to drive provide current to the n- and p-type semiconductors from the ICs of the backplane on which the microLED array is disposed. Methods of depositing materials, layers, and thin films may include, for example: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof, among others.

In some aspects, one or more other layers, such as a phosphor-converting layer that contains phosphor particles, may be disposed on some or all of the LEDs or LED arrays to convert at least a portion of the light from the LEDs to light of a different wavelength. For example, blue light may be converted into near infrared light or white light by the phosphor-converting layer.

In a number of applications, such as displays or vehicular applications, it may be desirable to generate white light. White light may be produced, as above, using a phosphor layer. In other aspects, light of various visible wavelengths may be combined to produce white light. For example, white light may be produced by adding Red (R), Green (G) and Blue (B) primary color LEDs. However, generation of a longer wavelength red provided by InGaN (about 600 nm to about 640 nm) results in lower wall plug efficiency (WPE). WPE is the amount of optical energy obtained from the LED compared with the electrical energy used to drive the junction (usually a multi-quantum well structure). In particular, longer wavelength R microLEDs may have a WPE that is about a few percent, compared to G or B microLEDs, which can produce WPEs from about 20% and about 25% respectively. A WPE of a state of the art shorter wavelength red (about 610 nm) microLED may rise to about 5.5%, at about 605 nm dominant wavelength (LDOM), but only about 3% at about 615 nm LDOM. LDOM is the single wavelength that is perceived by the human eye.

CIE standard illuminant D65 (D65) is a standard used for monitor and display calibration, and can be defined either by a particular spectral power distribution that is generated by a D series daylight simulator or chromaticity coordinates in the CIE (Commission Internationale de l'Éclairage) 1931 xy plane. In one example, the radiometric power by color for a D65 white is: B: about 36%, G: about 32%, R: about 32%; with a WPE per color of: B: about 20%, G: about 25%, R: about 5.5% This power distribution results in a power contribution per color of: B: about 20%, G: about 14%, R: about 66% and a total WPE for white of about 11%. The lm/Wopt (lumen/optical power) for D65 white is about 157 lm/Wopt. FIG. 1A shows an example spectral power distribution of a microLED pixel with red, green, and blue sub-pixels. The vertical axis of FIG. 1A is normalized power density. The LDOM peaks are about 470 nm (B), about 530 nm (G), and about 630 nm (R).

Figures 2A, 2B, 2C:
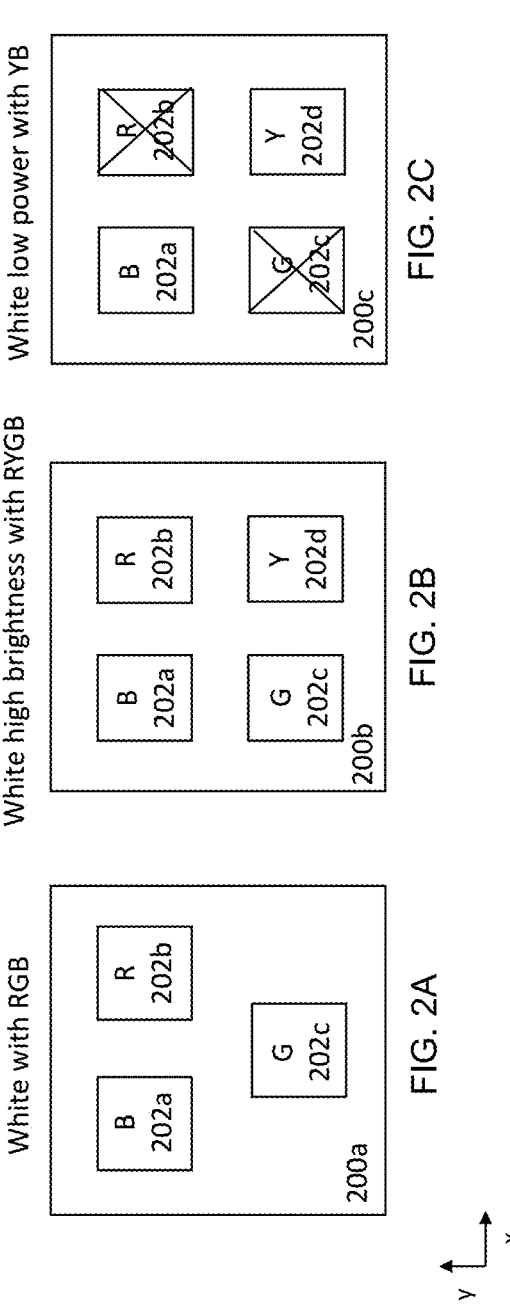
FIG. 2A illustrates an example microLED pixel with red, green, and blue sub-pixels in accordance with some aspects.
FIG. 2B illustrates an example microLED pixel with red, green, blue, and yellow sub-pixels in accordance with some aspects.
FIG. 2C illustrates an example microLED pixel with green, blue, and yellow sub-pixels in accordance with some aspects.

FIG. 2A illustrates an example microLED white pixel with red, green, and blue sub-pixels. Thus, the pixel 200a shown in FIG. 2A corresponds to the curve shown in FIG. 1A (FIG. 1B is discussed below). The pixel 200a generates white light through light emission from the blue sub-pixel 202a, the red sub-pixel 202b, and the green sub-pixel 202c.

FIGS. 2B and 2C illustrate an example microLED pixel with red, green, blue, and yellow sub-pixels. In FIG. 2B, the microLED pixel 200b generates white light through light emission from a blue sub-pixel 202a, a red sub-pixel 202b, a green sub-pixel 202c, and a yellow sub-pixel 202d. The yellow sub-pixel 202d may have an LDOM of, for example, about 572 nm. Yellow InGaN MicroLEDs may have a WPE of about 10%, which is much higher than red InGaN MicroLEDs, thereby providing improved efficiency. During growth, the junction (e.g., multiple quantum well structure) that produces the yellow light may be formed between the junction that produces the red light and the junction that produces the green light. The blue sub-pixel 202a, the red sub-pixel 202b, the green sub-pixel 202c, and the yellow sub-pixel 202d may be disposed over different lateral (the x-y plane) areas of the pixel 200b; the junctions that emit the light of different colors may thus be formed at different lateral locations within the the pixel 200b.

In FIG. 2C, the microLED pixel 200c, although the red sub-pixel 202b and the green sub-pixel 202c are present, white light is generated through light emission from only the blue sub-pixel 202a and a yellow sub-pixel 202d. FIG. 1B shows an example spectral power distribution of the microLED pixel 200c of FIG. 2C with only the blue sub-pixel 202a and yellow sub-pixel 202d activated (i.e., the red sub-pixel 202b and the green sub-pixel 202c are not activated). Alternatively, while the blue sub-pixel 202a and a yellow sub-pixel 202d are driven using a predetermined current to produce the white light, the red sub-pixel 202b and the green sub-pixel 202c may be driven at a lower current than that used to produce white light when all of the sub-pixels are driven. As shown in FIG. 1B, D65 with a 200 lm/Wopt output may be achieved by activating the blue sub-pixel 202a and yellow sub-pixel 202d, the same lm as in FIG. 1A with lower optical power. Specifically, a yellow WPE of about 9.9% in combination with a blue WPE of about 20% results in a white WPE of about 8.8%, to achieve the same overall power as RGB white. If a 572 nm MicroLED pixel has about 15% WPE, the white WPE may increase to about 12.1% and a system power reduction of about 17% may be able to be achieved. The LDOM peaks in FIG. 2B are about 470 nm (B) and about 570 nm (Y).

The white light generated by the microLED pixel 200b may have a higher brightness than that generated by the microLED pixel 200c. Thus, a processor may determine whether a particular white light brightness is to be displayed by the microLED pixel 200c and determine which of the sub-pixels to drive dependent on whether the brightness is to exceed a predetermined brightness threshold, e.g., if the brightness of a particular microLED pixel 200c to produce white light is not to exceed the predetermined brightness threshold, the processor may limit driving of the particular microLED pixel 200b to the blue sub-pixel 202a and yellow sub-pixel 202d (otherwise, all of the blue sub-pixel 202a, the red sub-pixel 202b, the green sub-pixel 202c, and the yellow sub-pixel 202d may be driven to produce white light). Alternatively, which of the sub-pixels is to be driven may be dependent on whether a power or efficiency threshold of the white light is to be exceeded, e.g., if the device that contains the array of the microLED pixels 200b is operating on battery power and/or the battery power is below the predetermined power threshold, the processor may limit driving of each of the microLED pixels 200b to produce white light to the blue sub-pixel 202a and yellow sub-pixel 202d (otherwise, all of the blue sub-pixel 202a, the red sub-pixel 202b, the green sub-pixel 202c, and the yellow sub-pixel 202d may be driven to produce white light). The relative emission intensities among the sub-pixels may change dependent on which pixels are activated, as well as the color to be provided, e.g., if white light with the same (or similar) characteristics is to be generated by the microLED pixel 200b and microLED pixel 200c, the emission intensity may be different between the blue sub-pixel 202a and yellow sub-pixel 202d.

The arrangement of the colors of the sub-pixels may be different from that shown in the microLED pixels shown in FIGS. 2A, 2B, and 2C. That is, the relative positions of at least a pair of the blue sub-pixel 202a, the red sub-pixel 202b, the green sub-pixel 202c, and the yellow sub-pixel 202d may be switched. In some aspects, the relative positions of the blue sub-pixel 202a, the red sub-pixel 202b, the green sub-pixel 202c, and the yellow sub-pixel 202d may remain the same throughout all of the array. In other aspects, the relative positions of the blue sub-pixel 202a, the red sub-pixel 202b, the green sub-pixel 202c, and the yellow sub-pixel 202d may be independent in each microLED pixel 200*b* or set of microLED pixels 200*b* (e.g., sub-array within the overall array, with the relative positions being the same within the sub-array).

In other operations, the yellow sub-pixel 202*d* may be used in more circumstances to merely produce white light. In some aspects, the yellow sub-pixel 202*d* may be used in general when more than merely the red sub-pixel 202*b* is activated. In addition, the yellow sub-pixel 202*d* may be used to increase brightness of the pixel 200*b*, while activating the red sub-pixel 202*b* and the green sub-pixel 202*c*.

The yellow sub-pixel 202*d* may also be used to maintain a subset of the total color gamut if either or both the red sub-pixel 202*b* or the green sub-pixel 202*c* fails by compensating for the absence of one or both. In some aspects, a processor may detect an abnormality in the current used to drive the red sub-pixel 202*b* and/or the green sub-pixel 202*c* of a particular pixel 200*b*, and based on the detection (as well as perhaps the length of time the abnormality persists, i.e., over a threshold period of time or more than a threshold number of abnormalities within a predetermined period of time) determine whether the red sub-pixel 202*b* and/or the green sub-pixel 202*c* has failed or is otherwise not operating as expected. The processor may then drive the yellow sub-pixel 202*d* based on the determination, and deactivate the problematic sub-pixel(s) to obtain the desired color. Alternatively, or in addition, one or more optical sensors may be used to detect problems with the red sub-pixel 202*b* and/or the green sub-pixel 202*c*, and the processor may drive the yellow sub-pixel 202*d* accordingly. The processor may determine driving of the yellow sub-pixel 202*d* to compensate for the failure using among others, a D65 color chart, Correlated Color Temperature (CCT), and Duv (the distance above or below the blackbody curve), to determine an amount of current to use to drive the yellow sub-pixel 202*d* to produce the desired color.

Figure 3:
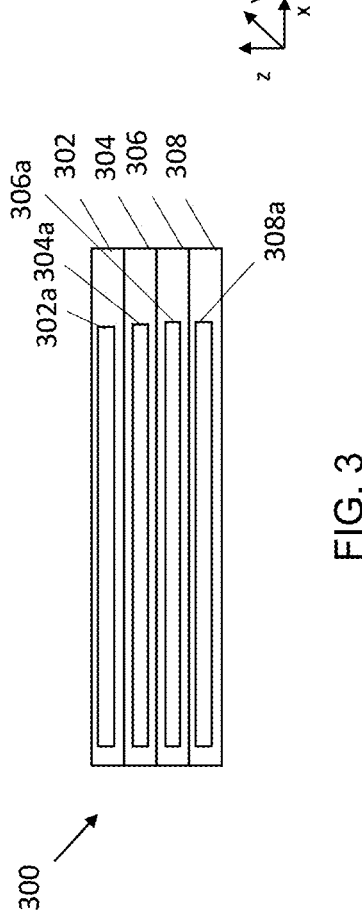
FIG. 3 shows a cross-sectional view of an example pixel shown in FIG. 2B in accordance with some aspects.

FIG. 3 shows a cross-sectional view of an example pixel shown in FIG. 2B. The pixel 300 may have multiple sets of layers 302, 304, 306, 308 in a growth direction (z). Each layer 302, 304, 306, 308 may contain a junction 302*a*, 304*a*, 306*a*, 308*a* that overlap in the (xy) direction. Each junction 302*a*, 304*a*, 306*a*, 308*a*, when driven, may emit light of a different color. Although the epitaxial semiconductor layers used for a particular junction 302*a*, 304*a*, 306*a*, 308*a* may be formed throughout the extent of the pixel 300, during processing (e.g., etching and metalization) the emission area of the junctions 302*a*, 304*a*, 306*a*, 308*a* may be limited as shown. Note that individual layers (e.g., metal contact, dielectric isolation) that form the sub-pixels are not shown for convenience in understanding the disclosed subject-matter.

Figure 4:
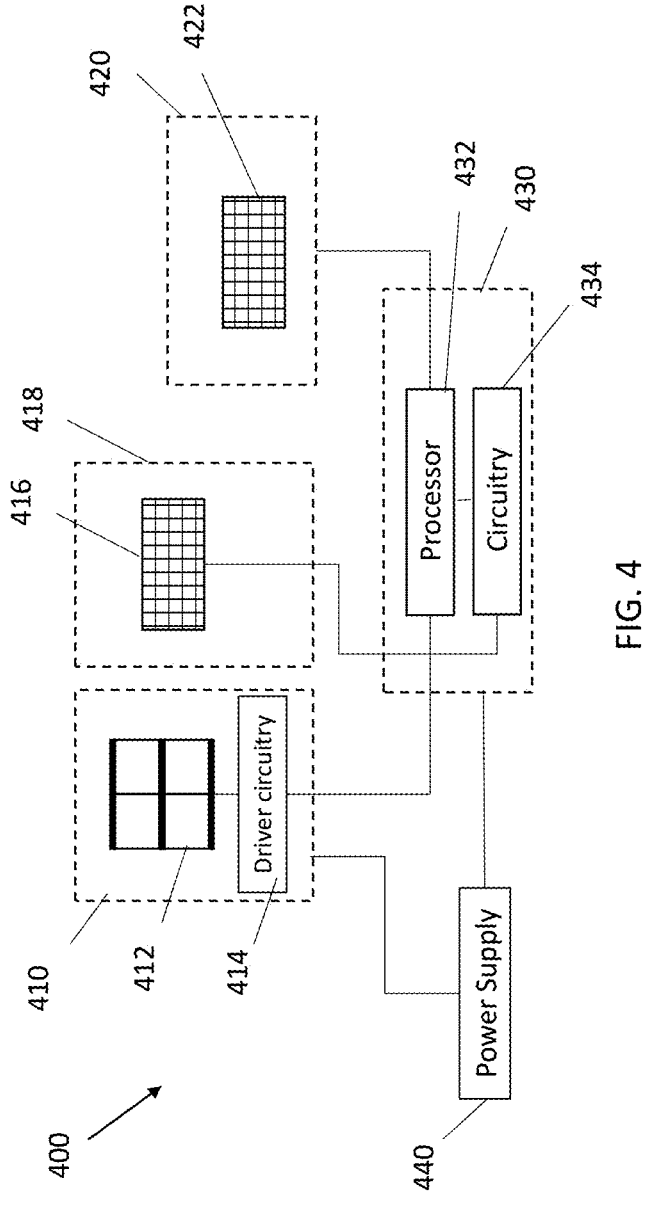
FIG. 4 shows an example lighting system that contains the microLED pixel shown in FIG. 2B in accordance with some aspects.

FIG. 4 shows an example lighting system that contains the microLED pixel shown in FIG. 2B. The system 400 may include one or more light sources 410. The light source 410 may include one or more microLED arrays 412, as described herein. The light source 410 may include driving circuitry 414, as also described herein. A light detector 418 may contain a photodiode array 416 that detects the light from the microLED devices in the light source 410. The photodiode array 416 may be disposed within an apparatus containing the light source 410 or may be separate from the light source 410. The A controller 430 may include a processor 432 (or equivalently, processing circuitry), which may be used to control various functions of the system 400. As also shown, the controller 430 may contain further components, such as a circuitry 434 configured to drive, among others, the photodiode array 416 as controlled by the processor 432. In some embodiments, the circuitry 434 may also be configured to provide non-local driving of the microLED array 412 of the light source 410 and may include other circuits, e.g., the non-FPGA circuitry shown in FIG. 4 (including the driver circuitry if not present in the light source 410).

The light source 410 may include at least one lens and/or other optical elements such as reflectors. In different embodiments, a single lens may be disposed over the microLED array 412 or multiple lenses may be disposed over the microLED array 412. The lens and/or other optical elements may direct the light emitted by the microLED array 412 toward a target.

The processor 432 may also control one or more sensors 420 that includes a multi-pixel detector 422. The sensor 420 may sense light at the wavelength or wavelengths emitted by the microLED array 412 and reflected by a target, radiation that is emitted by the target, and or other wavelengths. The sensor 420 may, for example, be a radar or lidar sensor, or the processor 432 may be used to determine the presence of specific objects (e.g., other vehicles, people, road signs) nearby. The sensor 420 may include optical elements (e.g., at least one sensor lens) to capture the radiation. The multi-pixel detector 422 may include, for example, photo-diodes or one or more other detectors capable of detecting light in the wavelength range(s) of interest. The multi-pixel detector 422 may include multiple different arrays to sense visible and/or infrared light. The multi-pixel detector 422 may have one or more segments (that are able to sense the same wavelength/range of wavelengths or different wavelength/range of wavelengths), similar to the photodiode array 416.

In some embodiments, instead of, or in addition to, being provided in the sensor 420, a multi-pixel detector may be provided in the light detector 418. In some embodiments, the light detector 418 and the sensor 420 may be integrated in a single module, while in other embodiments, the light detector 418 and the sensor 420 may be separate modules that are disposed on a printed circuit board (PCB) or other mount. In other embodiments, the light detector 418 and the sensor 420 may be attached to different PCBs or mounts. Similarly, the light source 410 may be integrated in a single module with the light detector 418 or may be separate from the light detector 418.

The microLEDs in the microLED array 412 may be driven as described herein. The components of the system 400 shown in FIG. 4 may be provided power using a power supply 440, such as a battery.

Figure 5:
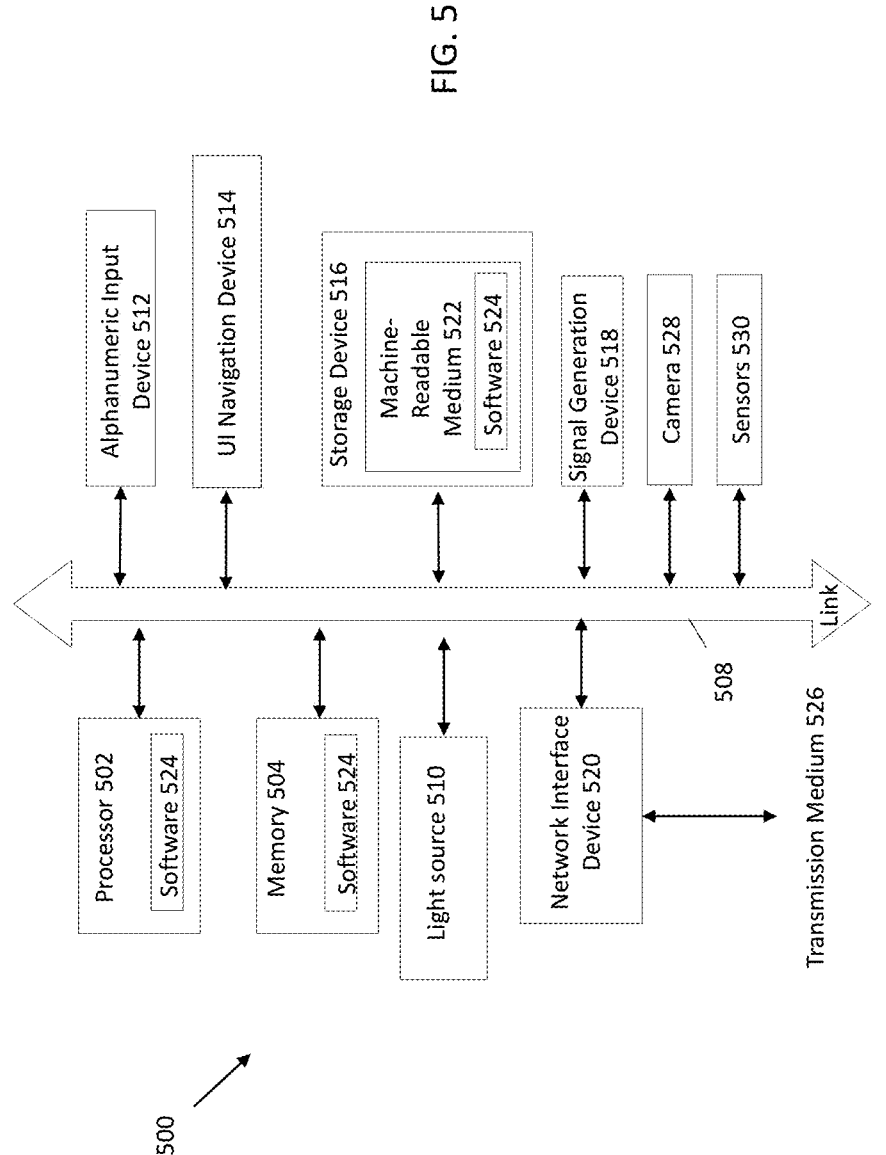
FIG. 5 shows an example of an electronic device in accordance with some aspects.

FIG. 5 illustrates an example of an electronic device 500 in accordance with some embodiments. The electronic device 500 may be, for example, a display, a monitor or screen, a wearable/mobile display device such as an AR/VR headset, a vehicular headlight, lighting for a particular area, or any other lighting arrangement. Various elements may be provided on a backplane indicated above, while other elements may be local or remote. Examples, as described herein, may include, or may operate on, logic or a number of components, modules, or mechanisms.

Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The electronic device 500 may include a hardware processor (or equivalently processing circuitry) 502 (e.g., a central processing unit (CPU), a GPU, a hardware processor core, or any combination thereof), a memory 504 (which may include main and static memory), some or all of which may communicate with each other via an interlink (e.g., bus) 508. The memory 504 may contain any or all of removable storage and non-removable storage, volatile memory or non-volatile memory. The electronic device 500 may further include a light source 510 such as the microLEDs described above, or a video display, an alphanumeric input device 512 (e.g., a keyboard), and a user interface (UI) navigation device 514 (e.g., a mouse). In an example, the light source 510, input device 512 and UI navigation device 514 may be a touch screen display. The electronic device 500 may additionally include a storage device (e.g., drive unit) 516, a signal generation device 518 (e.g., a speaker), a network interface device 520, one or more cameras 528, and one or more sensors 530, such as a global positioning system (GPS) sensor, compass, accelerometer, or other sensor such as those described herein. The electronic device 500 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). Some of the elements, such as one or more of the sparse arrays that provide the light source 510 may be remote from other elements and may be controlled by the hardware processor 502.

The storage device 516 may include a non-transitory machine readable medium 522 (hereinafter simply referred to as machine readable medium) on which is stored one or more sets of data structures or instructions 524 (e.g., software) embodying or utilized by any one or more of the techniques or functions described herein. A storage device 516 that includes the non-transitory machine readable medium should not be construed either as the device or the machine-readable medium is itself incapable of having physical movement. The instructions 524 may also reside, completely or at least partially, within the memory 504 and/or within the hardware processor 502 during execution thereof by the electronic device 500. While the machine readable medium 522 is illustrated as a single medium, the term "machine readable medium" may include a single medium or multiple media (e.g., a centralized or distributed database, and/or associated caches and servers) configured to store the one or more instructions 524.

The term "machine readable medium" may include any medium that is capable of storing, encoding, or carrying instructions for execution by the electronic device 500 and that cause the electronic device 500 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 524 may further be transmitted or received over a communications network using a transmission medium 526 via the network interface device 520 utilizing any one of a number of wireless local area network (WLAN) transfer protocols or a SPI or CAN bus. Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 502.11 family of standards known as Wi-Fi, IEEE 502.14 family of standards known as WiMax, IEEE 502.14.4 family of standards, a Long Term Evolution (LTE) family of standards, a Universal Mobile Telecommunications System (UMTS) family of standards, peer-to-peer (P2P) networks, a next generation (NG)/6$^{th}$ generation (6G) standards among others. In an example, the network interface device 520 may include one or more physical jacks (e.g., Ethernet, coaxial, or phone jacks) or one or more antennas to connect to the transmission medium 526.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical CPU, a single- or multi-core processor, and/or any other device capable of executing or otherwise operating computer-executable instructions, such as program code, software modules, and/or functional processes.

The camera 528 may sense light at least the wavelength or wavelengths emitted by the microLEDs. The camera 528 may include optical elements (e.g., at least one camera lens) that are able to collect reflected light of illumination that is reflected from and/or emitted by an illuminated region. The camera lens may direct the reflected light onto a multi-pixel sensor (also referred to as a light sensor) to form an image of on the multi-pixel sensor.

The processor 502 may control and drive the LEDs via one or more drivers. For example, the processor 502 may optionally control one or more microLEDs in microLED arrays independent of another one or more microLEDs in the microLED arrays, so as to illuminate an area in a specified manner.

In addition, the sensors 530 may be incorporated in the camera 528 and/or the light source 510. The sensors 530 may sense visible and/or infrared light and may further sense the ambient light and/or variations/flicker in the ambient light in addition to reception of the reflected light from the LEDs. The sensors may have one or more segments (that are able to sense the same wavelength/range of wavelengths or different wavelength/range of wavelengths), similar to the LED arrays.

Figure 6:
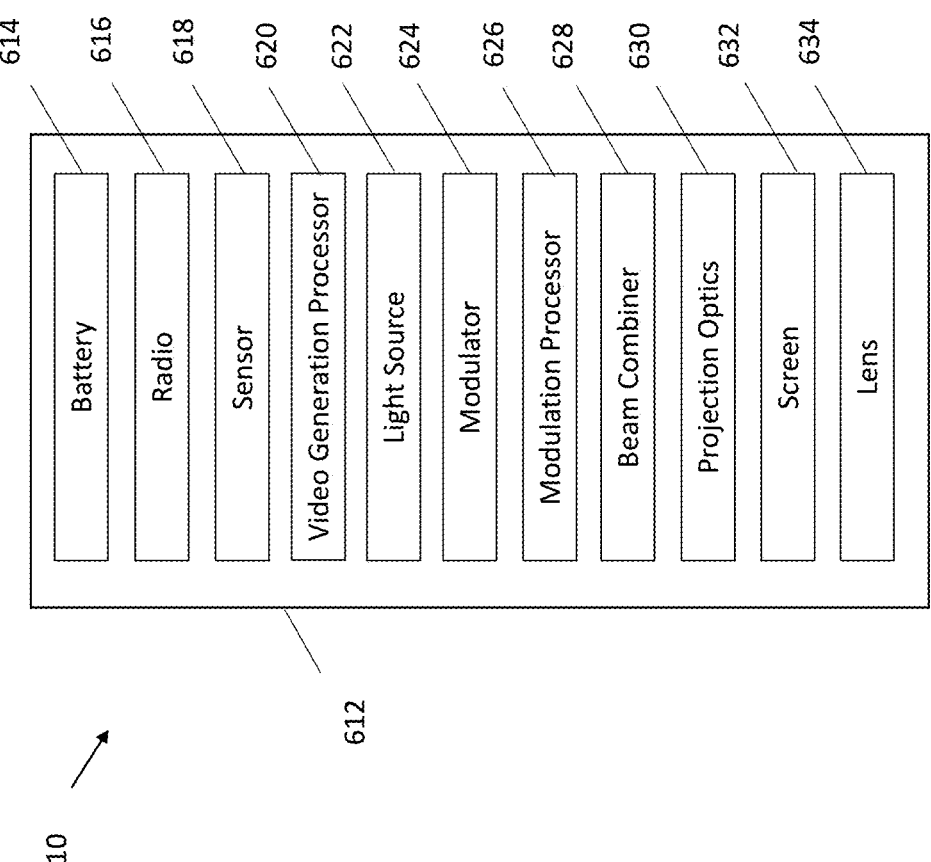
FIG. 6 shows a block diagram of an example of a visualization system that contains the microLED pixel described herein in accordance with some aspects.

FIG. 6 shows a block diagram of an example of a visualization system that contains the microLED pixel described herein. The visualization system 610 can include a wearable housing 612, such as a headset or goggles. The housing 612 can mechanically support and house the elements detailed below. In some examples, one or more of the elements detailed below can be included in one or more additional housings that can be separate from the wearable housing 612 and couplable to the wearable housing 612 wirelessly and/or via a wired connection. For example, a separate housing can reduce the weight of wearable goggles, such as by including batteries, radios, and other elements. The housing 612 can include one or more batteries 614, which can electrically power any or all of the elements detailed below. The housing 612 can include circuitry that can electrically couple to an external power supply, such as a wall outlet, to recharge the batteries 614. The housing 612 can include one or more radios 616 to communicate wirelessly with a server or network via a suitable protocol, such as WiFi.

The visualization system 610 can include one or more sensors 618, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 618 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 618 can capture a real-time video image of the surroundings proximate a user.

The visualization system 610 can include one or more video generation processors 620. The one or more video generation processors 620 may receive scene data from a server and/or a storage medium. The scene data may represent a three-dimensional scene, such as a set of position coordinates for objects in the scene or a depth map of the scene. The one or more video generation processors 620 can receive one or more sensor signals from the one or more sensors 618. In response to the scene data, which represents the surroundings, and at least one sensor signal, which represents the location and/or orientation of the user with respect to the surroundings, the one or more video generation processors 620 can generate at least one video signal that corresponds to a view of the scene. In some examples, the one or more video generation processors 620 can generate two video signals, one for each eye of the user, that represent a view of the scene from a point of view of the left eye and the right eye of the user, respectively. In some examples, the one or more video generation processors 620 can generate more than two video signals and combine the video signals to provide one video signal for both eyes, two video signals for the two eyes, or other combinations.

The visualization system 610 can include one or more light sources 622 such as those described herein that can provide light for a display of the visualization system 610. Suitable light sources 622 can include microLEDs as indicated above in addition to or instead of monolithic LEDs, one or more microLED arrays disposed on a common substrate, segmented microLEDs disposed on a single substrate whose microLEDs are individually addressable and controllable (and/or controllable in groups and/or subsets), and others. In some examples, one or more of the light sources 622 can include microLEDs disposed on a transparent flexible substrate, and a rigid substrate adhered to the transparent flexible substrate with an adhesive layer such that the microLEDs are located between the rigid substrate and the transparent flexible substrate.

The one or more light sources 622 can include light-producing elements having different colors or wavelengths. For example, a light source can include red microLEDs that can emit red light, green microLEDs that can emit green light, and blue microLEDs that can emit blue right. The red, green, and blue light combine in specified ratios to produce any suitable color that is visually perceptible in a visible portion of the electromagnetic spectrum.

The visualization system 610 can include one or more modulators 624. The modulators 624 can be implemented in one of at least two configurations.

In a first configuration, the modulators 624 can include circuitry that can modulate the light sources 622 directly. For example, the light sources 622 can include an array of light-emitting diodes, and the modulators 624 can directly modulate the electrical power, electrical voltage, and/or electrical current directed to each light-emitting diode in the array to form modulated light. The modulation can be performed in an analog manner and/or a digital manner. In some examples, the light sources 622 can include an array of red microLEDs, an array of green microLEDs, and an array of blue microLEDs, and the modulators 624 can directly modulate the red microLEDs, the green microLEDs, and the blue microLEDs to form the modulated light to produce a specified image.

In a second configuration, the modulators 624 can include a modulation panel, such as a liquid crystal panel. The light sources 622 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 624 can include multiple modulation panels that can modulate different colors of light. For example, the modulators 624 can include a red modulation panel that can attenuate red light from a red light source such as a red microLED, a green modulation panel that can attenuate green light from a green light source such as a green microLED, and a blue modulation panel that can attenuate blue light from a blue light source such as a blue microLED.

In some examples of the second configuration, the modulators 624 can receive uniform white light or nearly uniform white light from a white light source, such as a white-light microLED. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 610 can include one or more modulation processors 626, which can receive a video signal, such as from the one or more video generation processors 620, and, in response, can produce an electrical modulation signal. For configurations in which the modulators 624 directly modulate the light sources 622, the electrical modulation signal can drive the light sources 622. For configurations in which the modulators 624 include a modulation panel, the electrical modulation signal can drive the modulation panel.

The visualization system 610 can include one or more beam combiners 628 (also referred to as beam splitters), which can combine light beams of different colors to form a single multi-color beam. For configurations in which the light sources 622 can include multiple microLEDs of different colors, the visualization system 610 can include one or more wavelength-sensitive (e.g., dichroic) beam combiners 628 that can combine the light of different colors to form a single multi-color beam.

The visualization system 610 can direct the modulated light toward the eyes of the viewer in one of at least two configurations. In a first configuration, the visualization system 610 can function as a projector, and can include suitable projection optics 630 that can project the modulated light onto one or more screens 632. The screens 632 can be located a suitable distance from an eye of the user. The visualization system 610 can optionally include one or more lenses 634 that can locate a virtual image of a screen 632 at a suitable distance from the eye, such as a close-focus distance, such as 500 mm, 950 mm, or another suitable distance. In some examples, the visualization system 610 can include a single screen 632, such that the modulated light can be directed toward both eyes of the user. In some examples, the visualization system 610 can include two screens 632, such that the modulated light from each screen 632 can be directed toward a respective eye of the user. In some examples, the visualization system 610 can include more than two screens 632. In a second configuration, the visualization system 610 can direct the modulated light directly into one or both eyes of a viewer. For example, the projection optics 630 can form an image on a retina of an eye of the user, or an image on each retina of the two eyes of the user.

For some configurations of AR systems, the visualization system 610 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

Figure 7:
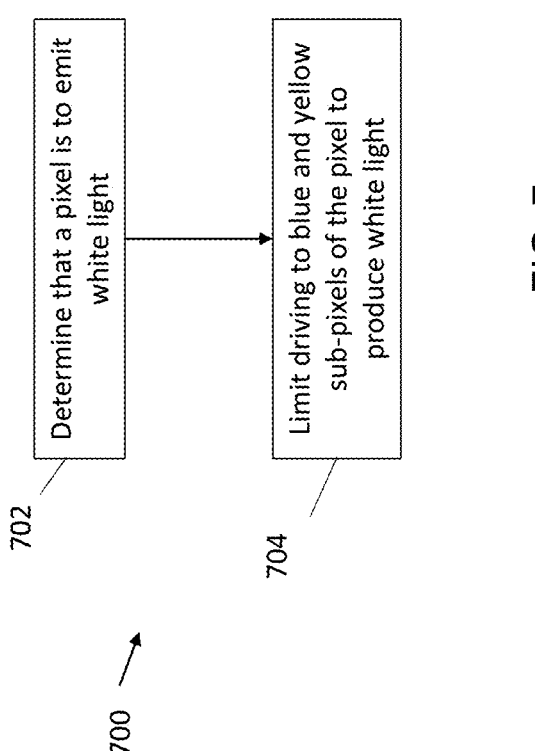
FIG. 7 shows an example method of driving a microLED array in accordance with some aspects.

FIG. 7 show an example method 700 of driving a microLED array. In some aspects, the method 700 of FIG. 7 may be performed by a device (e.g., a display or any other device indicated herein) or a portion thereof. At operation 702, the process may include determining that a pixel is to emit white light. At operation 704, the process may further include limiting driving of certain sub-pixels to blue and yellow sub-pixels of the pixel to produce the white light. The limiting may be in response to a determination that a predetermined efficiency is to be obtained and/or power usage is to be limited, for example. Note that other operations may be present.

Although reducing the power to provide white light is referred to above, in other embodiments, the yellow microLED may be used to produce other colors. To obtain the desired color when adding the yellow microLED, however, the bias voltage or current is determined to supply to the yellow microLED to generate a particular brightness.

Figure 8:
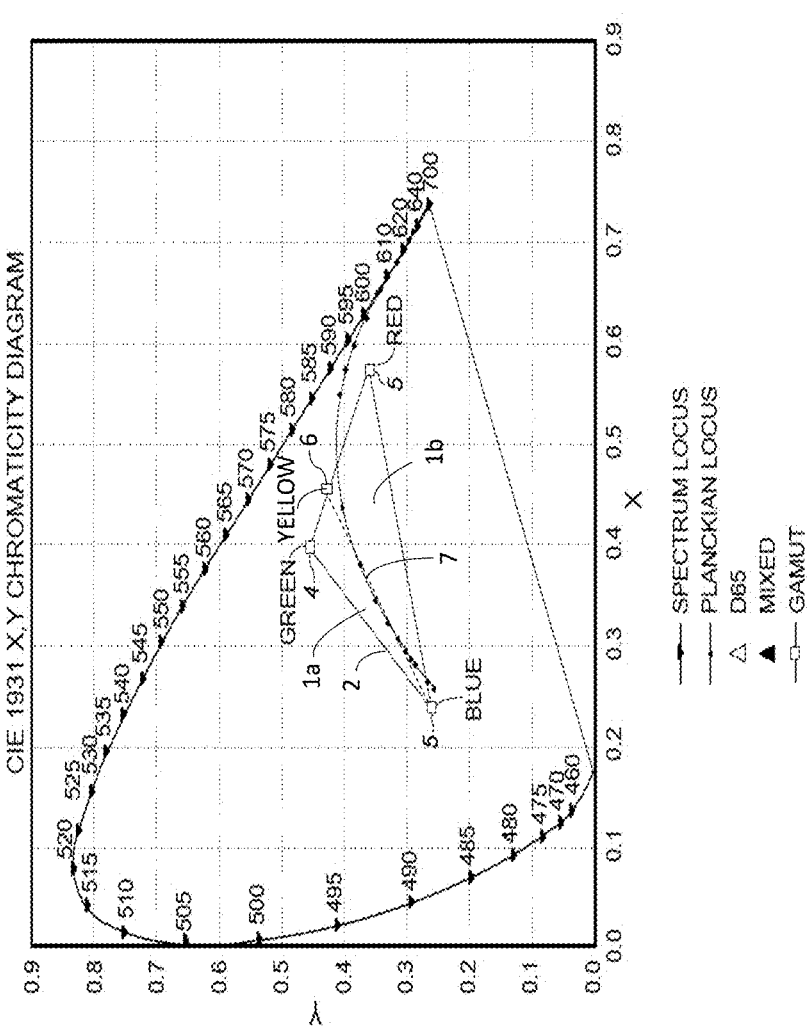
FIG. 8 illustrates a Commission Internationale de L'Eclairage (CIE) chromaticity diagram 1 representing a color space, according to some aspects.

FIG. 8 illustrates a CIE chromaticity diagram representing a color space, according to some aspects. A color space is a three-dimensional space; that is, a color is specified by a set of three numbers that specify the color and brightness of a particular homogeneous visual stimulus. The three numbers may be the CIE coordinates X, Y, and Z, or other values such as hue, colorfulness, and luminance. Based on the fact that the human eye has three different types of color sensitive cones, the response of the eye is often described in terms of these three "tristimulus values."

The chromaticity diagram of FIG. 8 is a color space projected into a two-dimensional space that ignores brightness. For example, the standard CIE XYZ color space corresponds to the chromaticity space specified by two chromaticity coordinates x, y. Chromaticity is an objective specification of the quality of a color regardless of its luminance. Chromaticity consists of two independent parameters, often specified as hue and colorfulness. Colorfulness may alternatively be referred to as saturation, chroma, intensity, or excitation purity. The chromaticity diagram includes the colors perceivable by the human eye. Chromaticity diagram uses parameters based on the spectral power distribution (SPD) of the light emitted from a colored object and are factored by sensitivity curves which have been measured for the human eye. Any color may be expressed precisely in terms of the two color coordinates x and y. The colors which can be matched by combining a given set of three primary colors, i.e., the blue, green, and red, are represented on the chromaticity diagram by a triangle 2 joining the coordinates for the three colors, i.e., red coordinate 3, green coordinate 4, and blue coordinate 5. Triangle 2 represents the color gamut, to which a yellow coordinate 6 is further added.

The chromaticity diagram includes the Planckian locus, or the black body line (BBL) 7. BBL 7 is the path or locus that the color of an incandescent black body would take in a particular chromaticity space as the blackbody temperature changes. The BBL 7 goes from deep red at low temperatures through orange, yellowish white, white, and finally bluish white at very high temperatures. Generally speaking, human eyes prefer white color points not too far away from BBL 7. Color points above BBL 7 appear too green while those below appear too pink.

Currently, any chromaticity $(x_c, y_c)$ with brightness $Y_c$ within the gamut characterized by the display gamut with cornerpoints, $(x_R, y_R)$; $(x_B, y_B)$; $(x_G, y_G)$ are able to be determined as a linear combination of the R, G, B primaries and their respective biases. Specifically, a chromaticity $(x_c, y_c)$ with brightness $Y_c$ may be represented as $(X_c, Y_c, Z_c)$ using:

$$X_c = \frac{X_c}{X_c + Y_c + Z_c}; Y_c = \frac{Y_c}{X_c + Y_c + Z_c}; Z_c = \frac{Z_c}{X_c + Y_c + Z_c}$$

This brightness is similar for the gamut cornerpoints with brightnesses $Y_R$, $Y_G$, $Y_B$. Thus:

$$\begin{bmatrix} X_c \\ Y_c \\ Z_c \end{bmatrix} = \begin{bmatrix} X_R & X_G & X_B \\ Y_R & Y_G & Y_B \\ Z_R & Z_G & Z_B \end{bmatrix} \cdot \begin{bmatrix} \bar{b}_R \\ \bar{b}_G \\ \bar{b}_B \end{bmatrix}$$

Where $\bar{b}$ is the bias for the primaries, i.e., $$\begin{bmatrix} \bar{b}_R \\ \bar{b}_G \\ \bar{b}_B \end{bmatrix} = \begin{bmatrix} X_R & X_G & X_B \\ Y_R & Y_G & Y_B \\ Z_R & Z_G & Z_B \end{bmatrix}^{-1} \cdot \begin{bmatrix} X_c \\ Y_c \\ Z_c \end{bmatrix}, \text{ or } \bar{b} = P^{-1} \cdot \bar{c}$$

In aspects, the gamut may be divided into two areas that are separated by the line between the blue and yellow chromaticities, shown by the dotted line in FIG. 8. The first gamut 1a and the second gamut 1b thus formed may be defined by different chromaticities, specifically: the first gamut 1a may be defined by the chromaticity $(x_Y, y_Y)$; $(x_B, y_B)$; $(x_G, y_G)$, and the second gamut 1b may be defined by the chromaticity $(x_Y, y_Y)$; $(x_B, y_B)$; $(x_R, y_R)$.

Figure 9:
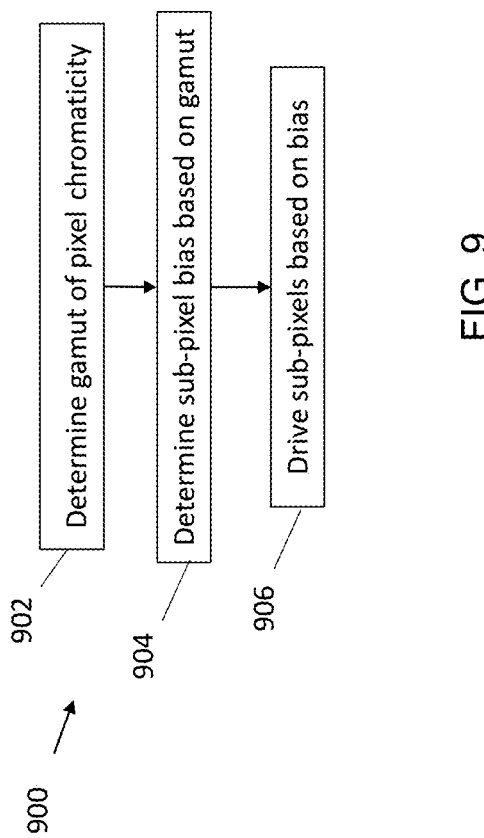
FIG. 9 shows an example method of driving a microLED array in accordance with some aspects.

Thus, with the addition of the yellow sub-pixel, the bias applied to the yellow sub-pixel may be determined using the first gamut 1a and the second gamut 1b. In particular, FIG. 9 shows an example method of driving a microLED array in accordance with some aspects. In some aspects, the process 900 of FIG. 9 may be performed by a device or a portion thereof. The process 900 may be performed by processing circuitry independently for each pixel in the array.

At operation 902, the gamut of the pixel chromaticity $(x_c, y_c)$ may be determined. In other words, it is determined whether the pixel chromaticity $(x_c, y_c)$ falls within the first gamut 1a or whether the pixel chromaticity $(x_c, y_c)$ falls within the second gamut 1b.

At operation 904, the bias of each sub-pixel may be determined based on the gamut determined at operation 902. That is, if it is determined at operation 902 that the pixel chromaticity $(x_c, y_c)$ falls within the first gamut 1a, the yellow, green, and blue sub-pixels may be determined to have a non-zero bias $$(\bar{b}_1 = P_1^{-1} \cdot \bar{c}),$$

while the red sub-pixel may have a zero bias. Similarly, if it is determined at operation 902 that the pixel chromaticity $(x_c, y_c)$ falls within the second gamut 1b, the yellow, red, and blue sub-pixels may be determined to have a non-zero bias $$(\bar{b}_2 = P_2^{-1} \cdot \bar{c}),$$

while the green sub-pixel may have a zero bias.

At operation 906, the sub-pixels in the pixel are driven dependent on the bias of each sub-pixel determined at operation 904.

In other aspects, rather than using cardinal gamut cornerpoints at yellow, blue, green, and red, a predetermined number of virtual gamut cornerpoints may be used. One or more of the virtual gamut cornerpoints may be defined by the G-Y-R line and may be a linear combination of the red, yellow, and green sub-pixel with a preset nominal bias. For each chromaticy (x,y) the optimal combination of Red, Yellow, Green, and Blue may be determined and captured in a lookup table accessed by the processing circuitry for driving the LEDs.

EXAMPLES

Example 1 is a micro light-emitting diode (microLED) device comprising: an array of pixels, each pixel containing a plurality of sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light; and a processor configured to select, for each pixel to produce white light, between driving the blue sub-pixel and yellow sub-pixel to produce the white light and driving the blue sub-pixel, the red sub-pixel, the green sub-pixel, and the yellow sub-pixel to produce the white light.

In Example 2, the subject matter of Example 1 includes, wherein the sub-pixels are limited to the blue sub-pixel, the red sub-pixel, the green sub-pixel, and the yellow sub-pixel.

In Example 3, the subject matter of Examples 1-2 includes, wherein the processor is further configured to drive the yellow sub-pixel in response to driving the red sub-pixel and at least one other sub-pixel.

In Example 4, the subject matter of Examples 1-3 includes, wherein the processor is further configured to select, for each pixel to produce white light, driving of the sub-pixels to produce the white light dependent on at least one characteristic of the pixel, the at least one characteristic selected from a group of characteristics that include brightness, efficiency of the white light produced, and power source used to generate the white light.

In Example 5, the subject matter of Example 4 includes, wherein the processor is further configured to, in response to a determination that a brightness of the white light is to exceed a predetermined threshold, drive all of the sub-pixels to produce the white light.

In Example 6, the subject matter of Examples 1-5 includes, wherein a yellow junction configured to emit yellow light to form the yellow sub-pixel is disposed between a red junction configured to emit red light to form the red sub-pixel and a green junction configured to emit green light to form the green sub-pixel.

In Example 7, the subject matter of Examples 1-6 includes, wherein, for each pixel, each of the blue sub-pixel, the red sub-pixel, the green sub-pixel, and the yellow sub-pixel are disposed in a different lateral area of the pixel.

In Example 8, the subject matter of Examples 1-7 includes, wherein the white light is substantially D65 white.

In Example 9, the subject matter of Examples 1-8 includes, wherein the yellow light has a dominant wavelength (LDOM) of about 572 nm.

In Example 10, the subject matter of Examples 1-9 includes, wherein, for each pixel, the processor is further configured to: determine whether at least one of the red sub-pixel and the green sub-pixel has failed, and in response to a determination that the at least one of the red sub-pixel and the green sub-pixel has failed, maintain at least a subset of a total color gamut to be generated by the pixel using the yellow sub-pixel in place of the at least one of the red sub-pixel and the green sub-pixel.

In Example 11, the subject matter of Example 10 includes, color chart, Correlated Color Temperature (CCT), and a distance (Duv) above or below a blackbody curve.

Example 12 is a control system comprising: drivers configured to drive rows and columns of an array of micro light light-emitting diode (microLED) pixels, each pixel containing a plurality of sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light; and a processor configured to select, for each pixel to produce white light, between control of the drivers to drive the blue sub-pixel and yellow sub-pixel to produce the white light and to drive the blue sub-pixel, the red sub-pixel, the green sub-pixel, and the yellow sub-pixel to produce the white light.

In Example 13, the subject matter of Example 12 includes, wherein the processor is further configured to control the drivers to drive the yellow sub-pixel in response to driving the red sub-pixel and at least one other sub-pixel.

In Example 14, the subject matter of Examples 12-13 includes, wherein the processor is further configured to control the drivers dependent on at least one characteristic of the pixel, the at least one characteristic selected from a group of characteristics that include brightness, efficiency of the white light produced, and power source used to generate the white light.

In Example 15, the subject matter of Example 14 includes, wherein the processor is further configured to, in response to a determination that a brightness of the white light is to exceed a predetermined threshold, control the drivers to drive all of the sub-pixels to produce the white light.

In Example 16, the subject matter of Examples 12-15 includes, wherein, for each pixel, the processor is further configured to: determine whether at least one of the red sub-pixel or green sub-pixel has failed, and in response to a determination that the at least one of the red sub-pixel or green sub-pixel has failed, control the drivers to maintain at least a subset of a total color gamut to be generated by the pixel by driving the yellow sub-pixel in place of the at least one of the red sub-pixel or green sub-pixel.

Example 17 is a method of providing light from an array of micro light-emitting diode (microLED) pixels, each pixel containing a plurality of sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light, the method comprising: selecting, for each pixel to produce white light, between driving the blue sub-pixel and the yellow sub-pixel to produce the white light and driving the blue sub-pixel, the red sub-pixel, the green sub-pixel, and the yellow sub-pixel to produce the white light.

Example 18 is a tangible machine-readable medium that stores instructions for execution by one or more processors of a micro light-emitting diode (microLED) device, the one or more processors configure the microLED device to, when the instructions are executed perform operations comprising: selecting, for each pixel to produce white light in an array of pixels, a set of sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light, the set of sub-pixels selected from a group of sets that include, a first set that contains the blue sub-pixel and the yellow sub-pixel and a second set that contains the blue sub-pixel, the red sub-pixel, the green sub-pixel, and the yellow sub-pixel; and controlling driving of the set of sub-pixels to produce the white light.

In Example 19, the subject matter of Example 18 includes, wherein the one or more processors further configure the microLED device to perform operations comprising, when the instructions are executed, controlling driving of the yellow sub-pixel in response to driving the red sub-pixel and at least one other sub-pixel.

In Example 20, the subject matter of Examples 18-19 includes, wherein the one or more processors further configure the microLED device to perform operations comprising, when the instructions are executed, selecting, for each pixel to produce white light, driving of the sub-pixels to produce the white light dependent on at least one characteristic of the pixel, the at least one characteristic selected from a group of characteristics that include brightness, efficiency of the white light produced, and power source used to generate the white light.

In Example 21, the subject matter of Example 20 includes, wherein the one or more processors further configure the microLED device to perform operations comprising, when the instructions are executed, controlling driving of all of the sub-pixels to produce the white light in response to a determination that a brightness of the white light is to exceed a predetermined threshold.

In Example 22, the subject matter of Examples 18-21 includes, wherein the one or more processors further configure the microLED device to perform operations comprising, when the instructions are executed, for each pixel: determining whether at least one of the red sub-pixel or green sub-pixel has failed, and in response to a determining that the at least one of the red sub-pixel or green sub-pixel has failed, maintaining at least a subset of a total color gamut to be generated by the pixel using the yellow sub-pixel in place of the at least one of the red sub-pixel or green sub-pixel.

Example 23 is a method of providing light from an array of micro light emitter (microLED) pixels, each pixel containing a plurality of sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light, the method comprising, for each pixel: determining a gamut of pixel chromaticity for a particular color to be produced by the pixel, each gamut defined by a different triad of colors in a color space chromaticity diagram; determining a bias of each sub-pixel based on the gamut determined; and controlling driving of the sub-pixels based on the bias to produce the particular color.

In Example 24, the subject matter of Example 23 includes, selecting the gamut from a plurality of gamuts defined by red, green, yellow, and blue cornerpoints, the gamuts containing sets of gamuts that include a first gamut defined by blue, green, and yellow cornerpoints and a second gamut defined by red, blue, and yellow cornerpoints.

In Example 25, the subject matter of Examples 23-24 includes, selecting the gamut from a plurality of gamuts defined by virtual cornerpoints along a color line connecting red, yellow, and green that are linear combinations of red, green, and yellow.

Example 26 is a tangible machine-readable medium that stores instructions for execution by one or more processors of a micro light-emitting diode (microLED) device, the one or more processors configure the microLED device to, when the instructions are executed, for each pixel of the microLED device, to perform operations comprising: determining a gamut of pixel chromaticity for a particular color to be produced by the pixel, each gamut defined by a different triad of colors in a color space chromaticity diagram, the pixel containing sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light; determining a bias of each sub-pixel based on the gamut determined; and controlling driving of the sub-pixels based on the bias to produce the particular color.

In Example 27, the subject matter of Example 26 includes, wherein the one or more processors further configure the microLED device to perform operations comprising, when the instructions are executed, for each pixel selecting the gamut from a plurality of gamuts defined by red, green, yellow, and blue cornerpoints, the gamuts containing sets of gamuts that include a first gamut defined by blue, green, and yellow cornerpoints and a second gamut defined by red, blue, and yellow cornerpoints.

In Example 28, the subject matter of Examples 26-27 includes, wherein the one or more processors further configure the microLED device to perform operations comprising, when the instructions are executed, for each pixel selecting the gamut from a plurality of gamuts defined by virtual cornerpoints along a color line connecting red, yellow, and green that are linear combinations of red, green, and yellow.

In some embodiments, other components may be present, while in other embodiments not all of the components may be present. As indicated herein, although the term "a" is used herein, one or more of the associated elements may be used in different embodiments. For example, the term "a processor" configured to carry out specific operations includes both a single processor configured to carry out all of the operations as well as multiple processors individually configured to carry out some or all of the operations (which may overlap) such that the combination of processors carry out all of the operations; thus, the term "processor" is synonymous with "processing circuitry." Further, the term "includes" may be considered to be interpreted as "includes at least" the elements that follow.

While only certain features of the system and method have been illustrated and described herein, many modifications and changes will occur to those skilled in the art. It is, therefore, to be understood that the appended claims are intended to cover all such modifications and changes.

What is claimed is:

1. A micro light-emitting diode (microLED) device comprising:

an array of pixels, each pixel containing a plurality of sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light; and a processor configured to:

select, for each pixel to produce white light, between driving the blue sub-pixel and yellow sub-pixel to produce the white light and driving the blue sub-pixel, the red sub-pixel, the green sub-pixel, and the yellow sub-pixel to produce the white light, select, for each pixel to produce white light, driving of the sub-pixels to produce the white light dependent on at least one characteristic of the pixel, the at least one characteristic selected from a group of characteristics that include brightness, efficiency of the white light produced, and power source used to generate the white light, and in response to a determination that a brightness of the white light is to exceed a predetermined threshold, drive all of the sub-pixels to produce the white light.

2. The microLED device of claim 1, wherein the sub-pixels are limited to the blue sub-pixel, the red sub-pixel, the green sub-pixel, and the yellow sub-pixel.

3. The microLED device of claim 1, wherein the processor is further configured to drive the yellow sub-pixel in response to driving the red sub-pixel and at least one other sub-pixel.

4. The microLED device of claim 1, wherein a yellow junction configured to emit yellow light to form the yellow sub-pixel is disposed between a red junction configured to emit red light to form the red sub-pixel and a green junction configured to emit green light to form the green sub-pixel.

5. The microLED device of claim 1, wherein, for each pixel, each of the blue sub-pixel, the red sub-pixel, the green sub-pixel, and the yellow sub-pixel are disposed in a different lateral area of the pixel.

6. The microLED device of claim 1, wherein the white light is substantially D65 white.

7. The microLED device of claim 1, wherein the yellow light has a dominant wavelength (LDOM) of about 572 nm.

8. The microLED device of claim 1, wherein, for each pixel, the processor is further configured to:

determine whether at least one of the red sub-pixel and the green sub-pixel has failed, and in response to a determination that the at least one of the red sub-pixel and the green sub-pixel has failed, maintain at least a subset of a total color gamut to be generated by the pixel using the yellow sub-pixel in place of the at least one of the red sub-pixel and the green sub-pixel.

9. The microLED device of claim 8, wherein, to produce a color within the at least the subset of the total color gamut to be generated by the pixel, the processor is further configured to determine a current to drive the yellow sub-pixel using a reference, the reference selected from a group of references that include a D65 color chart, Correlated Color Temperature (CCT), and a distance (Duv) above or below a blackbody curve.

10. The microLED device of claim 1, wherein the processor is configured to:

determine that the power source is a battery and the microLED device is operating on battery power, and select the sub-pixels to be driven based on a determination that the microLED device is operating on battery power.

11. The microLED device of claim 1, wherein the processor is configured to:

determine that the power source is a battery, determine whether battery power of the battery is below a predetermined power threshold, and select the sub-pixels to be driven based on a determination of whether the battery power is below the predetermined power threshold.

12. The microLED device of claim 1, wherein the processor is configured to adjust relative emission intensities among the sub-pixels dependent on which pixels are activated.

13. The microLED device of claim 1, wherein relative positions of the blue sub-pixel, the red sub-pixel, the green sub-pixel, and the yellow sub-pixel are independent in each pixel or set of pixels.

14. A non-transitory machine-readable medium that stores instructions for execution by one or more processors of a micro light-emitting diode (microLED) device, the one or more processors configure the microLED device to, when the instructions are executed perform operations comprising:

selecting, for each pixel to produce white light in an array of pixels, a set of sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light, the set of sub-pixels selected from a group of sets that include a first set that contains the blue sub-pixel and the yellow sub-pixel and a second set that contains the blue sub-pixel, the red sub-pixel, the green sub-pixel, and the yellow sub-pixel, the selecting comprising selecting, for each pixel to produce white light, driving of the sub-pixels to produce the white light dependent on at least one characteristic of the pixel, the at least one characteristic selected from a group of characteristics that include brightness, efficiency of the white light produced, and power source used to generate the white light; and controlling driving of the set of sub-pixels to produce the white light, the controlling comprising controlling driving of all of the sub-pixels to produce the white light in response to a determination that a brightness of the white light is to exceed a predetermined threshold.

15. The non-transitory machine-readable medium of claim 14, wherein the one or more processors further configure the microLED device to perform operations comprising, when the instructions are executed, controlling driving of the yellow sub-pixel in response to driving the red sub-pixel and at least one other sub-pixel.

16. The non-transitory machine-readable medium of claim 14, wherein the one or more processors further configure the microLED device to perform operations comprising, when the instructions are executed, for each pixel:

determining whether at least one of the red sub-pixel or green sub-pixel has failed, and in response to a determining that the at least one of the red sub-pixel or green sub-pixel has failed, maintaining at least a subset of a total color gamut to be generated by the pixel using the yellow sub-pixel in place of the at least one of the red sub-pixel or green sub-pixel.

17. A micro light-emitting diode (microLED) device comprising:

an array of pixels; and a processor configured to, for each pixel:

determine a gamut of pixel chromaticity for a particular color to be produced by the pixel, each gamut defined by a different triad of colors in a color space chromaticity diagram, the pixel containing sub-pixels that each contain a microLED, the sub-pixels including a blue sub-pixel configured to emit blue light, a red sub-pixel configured to emit red light, a green sub-pixel configured to emit green light, and a yellow sub-pixel configured to emit yellow light;

determine a bias of each sub-pixel based on the gamut determined; and control driving of the sub-pixels based on the bias to produce the particular color, the driving comprising:

selecting, for each pixel to produce white light, driving of the sub-pixels to produce the white light dependent on at least one characteristic of the pixel, the at least one characteristic selected from a group of characteristics that include brightness, efficiency of the white light produced, and power source used to generate the white light, and driving of all of the sub-pixels to produce the white light in response to a determination that a brightness of the white light is to exceed a predetermined threshold.

18. The microLED device of claim 17, wherein the processor is further configured to, for each pixel, select the gamut from a plurality of gamuts defined by red, green, yellow, and blue cornerpoints, the gamuts containing sets of gamuts that include a first gamut defined by blue, green, and yellow cornerpoints and a second gamut defined by red, blue, and yellow cornerpoints.

19. The microLED device of claim 17, wherein the processor is further configured to, for each pixel, select the gamut from a plurality of gamuts defined by virtual cornerpoints along a color line connecting red, yellow, and green that are linear combinations of red, green, and yellow.

* * * * *